US012437978B2

(12) United States Patent
Ueda et al.

(10) Patent No.: US 12,437,978 B2
(45) Date of Patent: Oct. 7, 2025

(54) CLEANING METHOD OF FILM LAYER IN THE PLASMA PROCESSING APPARATUS

(71) Applicant: Hitachi High-Tech Corporation, Tokyo (JP)

(72) Inventors: Kazuhiro Ueda, Tokyo (JP); Kazuyuki Ikenaga, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/802,639

(22) PCT Filed: Aug. 23, 2021

(86) PCT No.: PCT/JP2021/030850
§ 371 (c)(1),
(2) Date: Aug. 26, 2022

(87) PCT Pub. No.: WO2023/026331
PCT Pub. Date: Mar. 2, 2023

(65) Prior Publication Data
US 2024/0203708 A1 Jun. 20, 2024

(51) Int. Cl.
*B08B 3/12* (2006.01)
*H01J 37/32* (2006.01)

(52) U.S. Cl.
CPC .......... *H01J 37/32862* (2013.01); *B08B 3/12* (2013.01); *H01J 37/32495* (2013.01); *H01J 2237/3151* (2013.01)

(58) Field of Classification Search
CPC ........... H01J 37/32862; H01J 37/32495; H01J 2237/3151; B08B 3/12
See application file for complete search history.

(56) References Cited

U.S. PATENT DOCUMENTS 10,941,303 B2 3/2021 Larsson et al.
2009/0133713 A1 5/2009 Ohmi et al.
(Continued)

FOREIGN PATENT DOCUMENTS

CN 101218375 A 7/2008
JP 2009-174000 A 8/2009
(Continued)

OTHER PUBLICATIONS

JP 2018197400 (Year: 2018).*
(Continued)

*Primary Examiner* — Alexander Markoff
(74) *Attorney, Agent, or Firm* — Miles & Stockbridge, P.C.

(57) ABSTRACT

A cleaning method of a protective film for a plasma processing apparatus, the protective film being formed on a surface of a base material disposed inside a processing chamber of the plasma processing apparatus for processing a wafer using plasma, and containing a material having resistance to the plasma, and the cleaning method includes: (a) a step of preparing the base material including the film containing yttrium on the surface; and (b) a step of cleaning performed by immersing the base material in a dilute nitric acid solution and performing ultrasonic irradiation on the film, in which in the step (b), an elution rate of yttrium is detected in the cleaning, and the cleaning is stopped after the elution rate of yttrium after a start of the ultrasonic irradiation sequentially goes through a first decrease, a first increase, and a second decrease and before a second increase occurs.

6 Claims, 5 Drawing Sheets

(56) References Cited

U.S. PATENT DOCUMENTS

| | | | | |
|---|---|---|---|---|
| 2009/0183835 | A1 | 7/2009 | Furuse et al. | |
| 2009/0191429 | A1 | 7/2009 | Maeda et al. | |
| 2013/0122218 | A1* | 5/2013 | Maeda | H01L 21/67069 427/353 |
| 2017/0029628 | A1* | 2/2017 | Takai | C09D 1/00 |
| 2017/0253955 | A1* | 9/2017 | Takai | C23C 4/04 |
| 2017/0282221 | A1* | 10/2017 | Lee | C11D 3/046 |

FOREIGN PATENT DOCUMENTS

| | | | |
|---|---|---|---|
| JP | 2009-176787 | A | 8/2009 |
| JP | 2017-031457 | A | 2/2017 |
| JP | 2019-519091 | A | 7/2019 |
| TW | 201817915 | A | 5/2018 |
| TW | 202116996 | A | 5/2021 |
| WO | 2007007782 | A1 | 1/2007 |

OTHER PUBLICATIONS

WO 2021124996 (Year: 2021).*
Search Report mailed Sep. 28, 2021 in International Application No. PCT/JP2021/030850.
Written Opinion mailed Sep. 28, 2021 in International Application No. PCT/JP2021/030850.
Office Action mailed Jul. 27, 2023 in Taiwanese Application No. 111129529.

* cited by examiner

[FIG. 1]
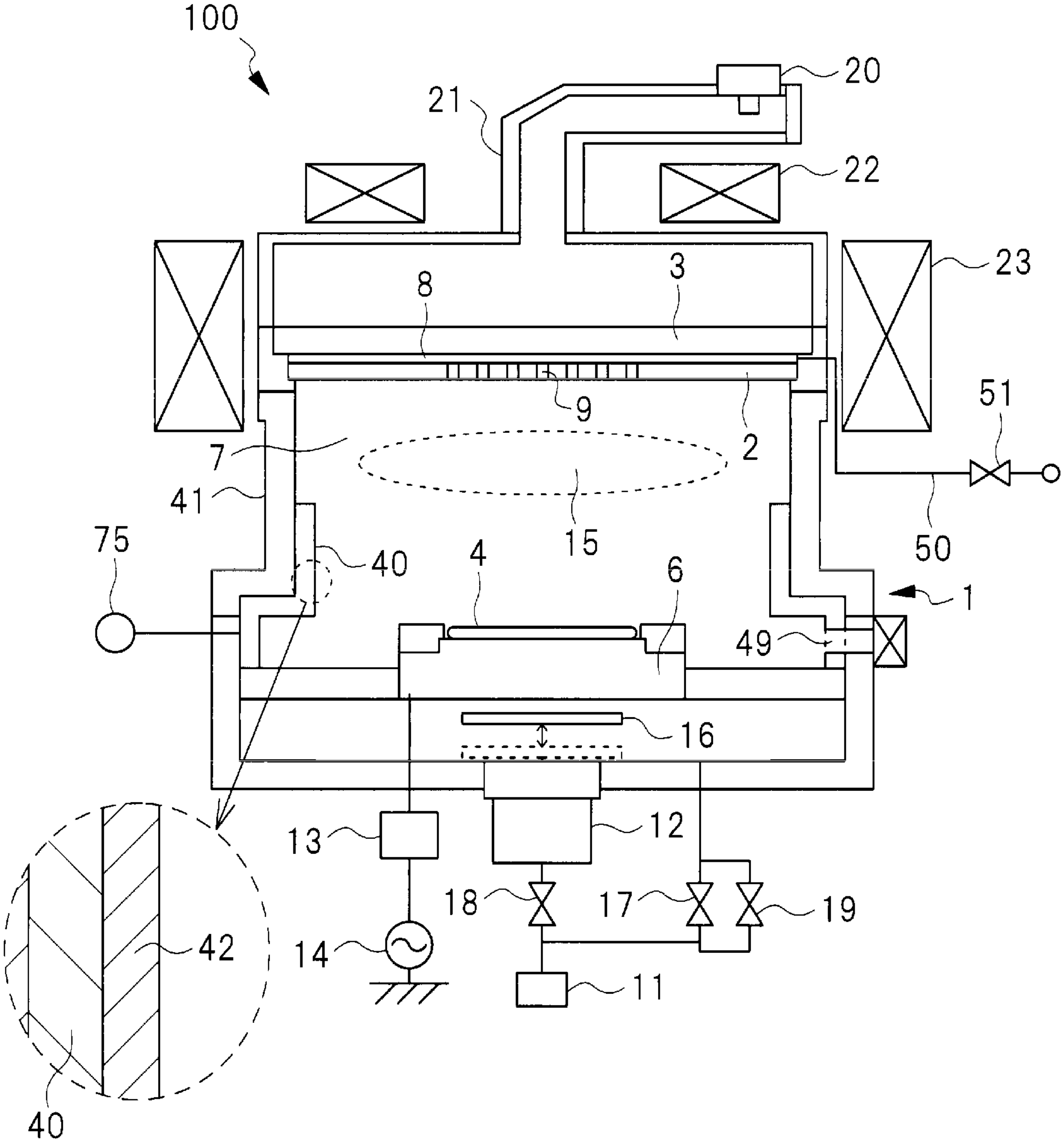

[FIG. 2]
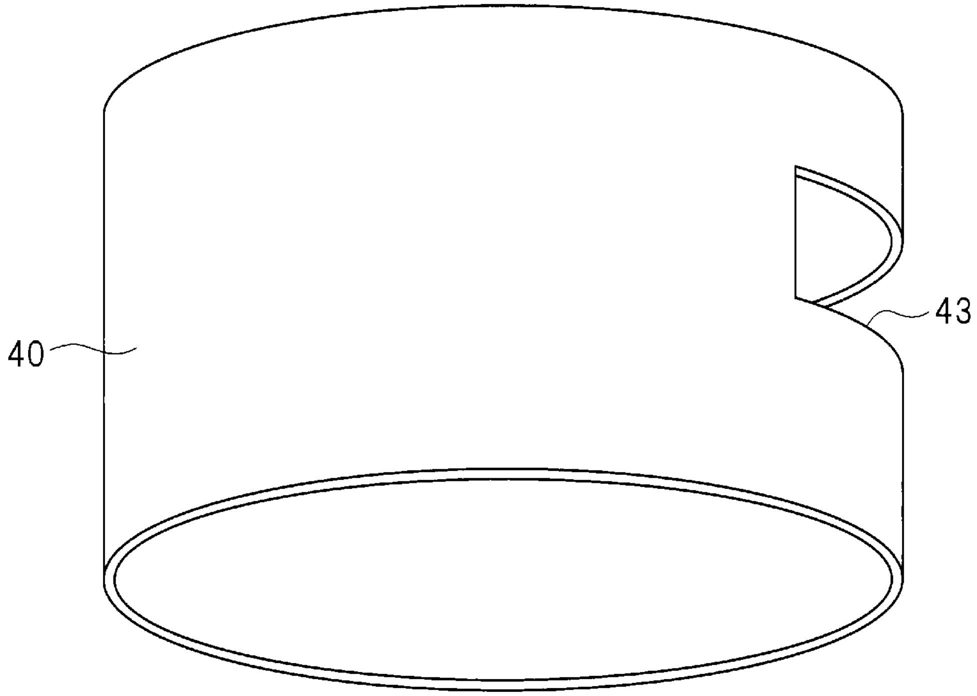

[FIG. 3]
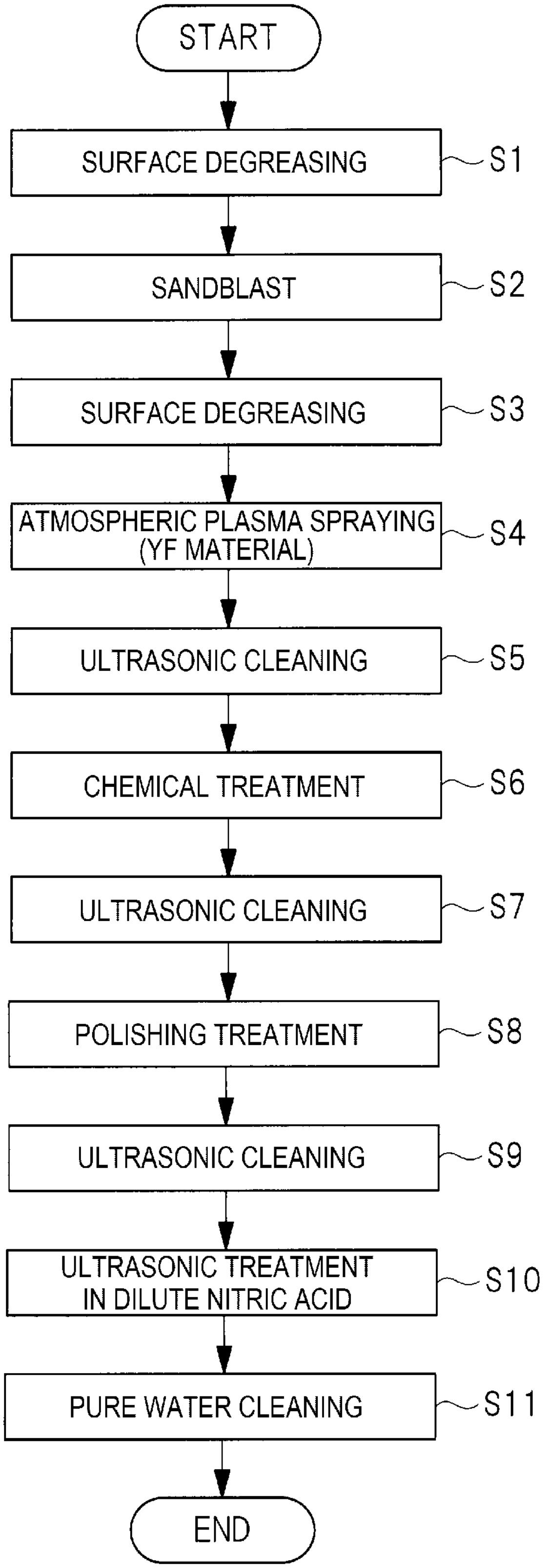

[FIG. 4]
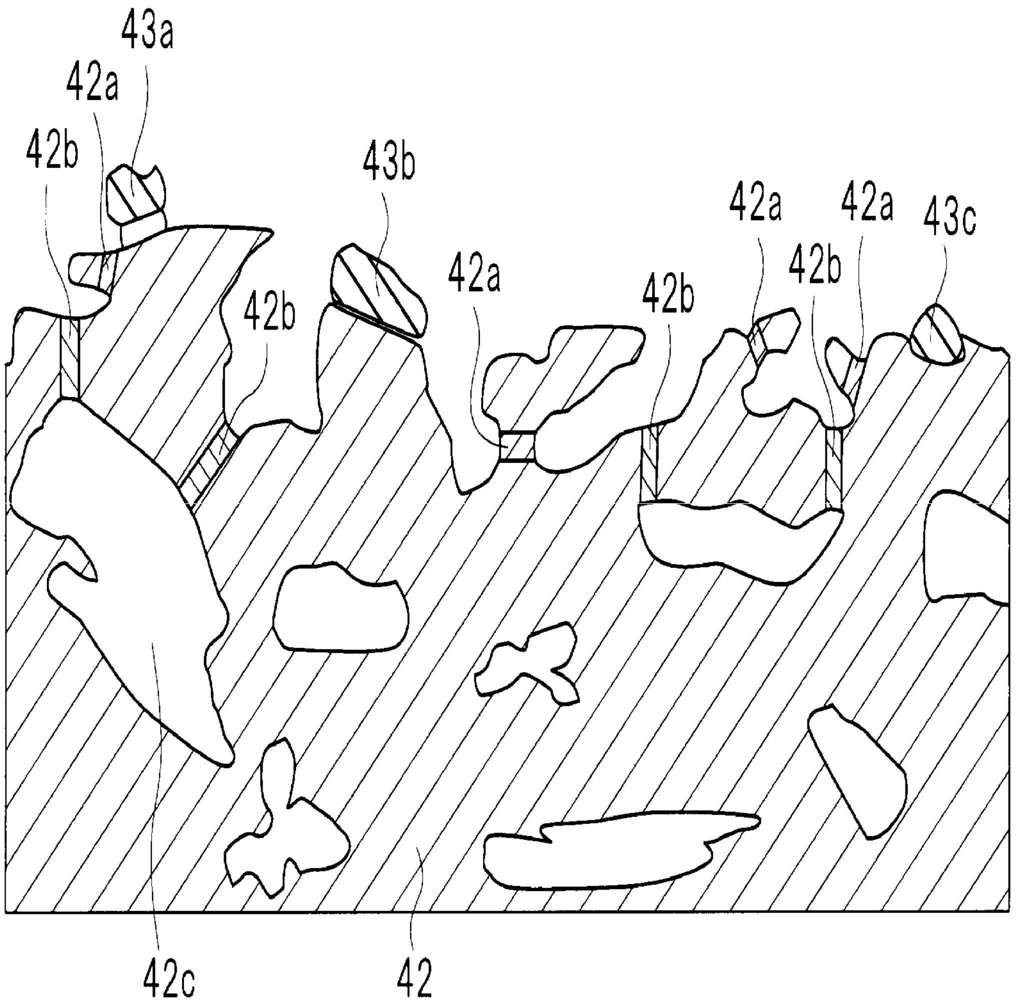

[FIG. 5]
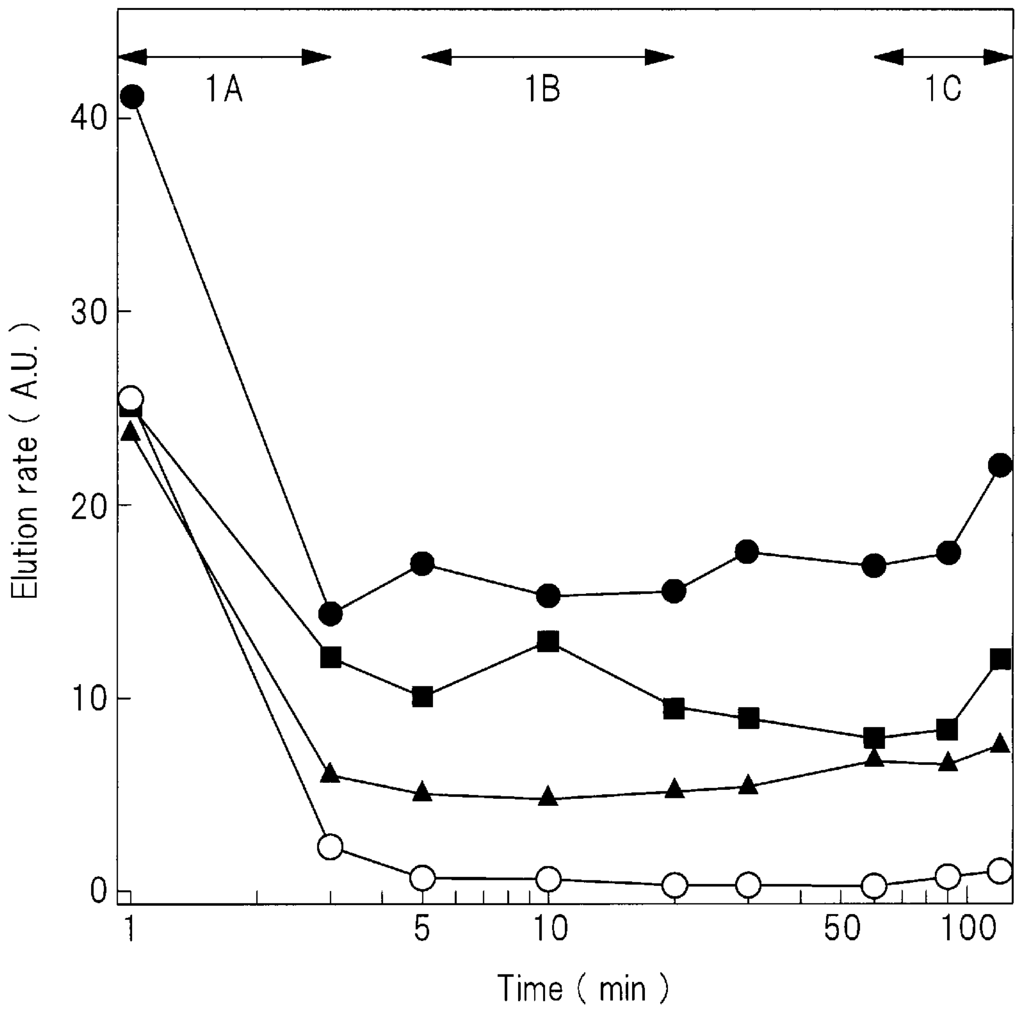
[FIG. 6]
| AFTER FILM FORMATION OF YF MATERIAL | AMOUNT (NUMBER) OF PARTICLES |
|---|---|
| RELATED ART 1: NO POST-TREATMENT | 100+ |
| RELATED ART 2: WITH POST-TREATMENT | 5.67 |
| PRESENT EMBODIMENT | 3.76 |

CLEANING METHOD OF FILM LAYER IN THE PLASMA PROCESSING APPARATUS

TECHNICAL FIELD

The present invention relates to a cleaning method of a protective film for a plasma processing apparatus.

BACKGROUND ART

Plasma etching is applied to microfabrication in manufacture of an electronic device and a magnetic memory. Since an inner wall of a processing chamber of a plasma processing apparatus that performs the plasma etching is exposed to radio frequency plasma and an etching gas during an etching process, an inner wall surface is protected by forming a film having excellent plasma resistance.

PTL 1 (JP-A-2009-176787) discloses that a protection film material that covers a ground part in a plasma etching apparatus is implemented by one or more types of $Al_2O_3$, YAG, $Y_2O_3$, $Gd_2O_3$, $Yb_2O_3$ or $YF_3$. PTL 2 (JP-A-2017-31457) describes a cleaning method of immersing a base material in which a thermal spray coating is formed on a surface thereof in an organic acid.

CITATION LIST

Patent Literature

PTL 1: JP-A-2009-176787

PTL 2: JP-A-2017-31457

SUMMARY OF INVENTION

Technical Problem

Since the film having plasma resistance is required to have low surface roughness (Ra) and low porosity, post-treatment such as polishing a surface of the film is performed after film formation. However, by the post-treatment, particles are easily adhered to an object to be etched due to discharge of surface-adhering particles caused by a region having a thin wall thickness or an inner wall material that is electrostatically adsorbed. Therefore, there is a need for a cleaning method that reduces generation of the particles after the post-treatment.

An object of the invention is to provide a cleaning method of a protective film for a plasma processing apparatus having high reliability.

Other objects and novel characteristics will be apparent from description of the present description and the accompanying drawings.

Solution to Problem

A summary of a representative embodiment of embodiments disclosed in the present application will be briefly described as follows.

According to the cleaning method of a protective film for a plasma processing apparatus of a representative embodiment, the protective film containing yttrium oxide or yttrium fluoride oxide or yttrium aluminum garnet and being formed on a surface of a base material disposed inside a processing chamber of the plasma processing apparatus for processing a wafer to be processed placed in the processing chamber disposed inside a vacuum chamber by using plasma formed in the processing chamber, the cleaning method comprising a step of cleaning performed by immersing the base material in a dilute nitric acid solution and performing ultrasonic irradiation on the film for the plasma processing apparatus, in which the cleaning is stopped after an elution rate of yttrium after a start of the ultrasonic irradiation sequentially goes through a first decrease, a first increase, and a second decrease and before a second increase occurs.

Advantageous Effects of Invention

According to the representative embodiment, it is possible to provide a cleaning method of a protective film for a plasma processing apparatus having high reliability.

BRIEF DESCRIPTION OF DRAWINGS

FIG. 1 is a vertical cross-sectional view schematically showing an outline of a configuration of a plasma processing apparatus according to an embodiment of the invention.

FIG. 2 is a perspective view schematically showing an outline of a configuration of a component forming a ground electrode shown in FIG. 1.

FIG. 3 is a flow illustrating a forming step and a cleaning step of a protective film for a plasma processing apparatus according to the embodiment of the invention.

FIG. 4 is an enlarged cross-sectional view showing a vicinity of a surface of the protective film for a plasma processing apparatus according to the embodiment of the invention.

FIG. 5 is a graph showing a relationship between an elution rate and a time in the cleaning step of the protective film for a plasma processing apparatus.

FIG. 6 is a table showing the number of particles when plasma etching is performed in each of cases of the related arts 1 and 2 or the present embodiment.

DESCRIPTION OF EMBODIMENTS

Hereinafter, embodiments of the invention will be described in detail with reference to drawings. In all the drawings for illustrating the embodiments, members having the same functions are denoted by the same reference numerals, and repetitive description thereof will be omitted. In the embodiments, the description of the same or similar portions will not be repeated in principle unless particularly necessary.

<Details of Room for Improvement>

Plasma etching may be applied in a manufacturing step of an electronic device and the like. Since a processing chamber of a plasma processing apparatus used for the plasma etching is disposed inside a vacuum chamber, the processing chamber is made of metal such as aluminum or stainless steel. Since an inner wall of the processing chamber of the plasma processing apparatus is exposed to radio frequency plasma and an etching gas during an etching process, an inner wall surface is protected by forming a film having excellent plasma resistance. A film made of yttrium oxide may be used as such a protective film.

Generation of particles in the processing chamber causes a manufacturing failure due to adhesion of the particles to an object to be etched, and causes a decrease in yield. Therefore, it is important to prevent the generation of the particles in the processing chamber. The generation of the particles in the processing chamber correlates with a crystallite size and a crystal phase ratio of an inner wall material.

The film containing yttrium oxide as a material is formed using, for example, an atmospheric plasma spraying method or the like. In the atmospheric plasma spraying method, raw material powder with a size of 10 to 60 μm is introduced into a plasma flame together with a transport gas, and raw material particles in a molten or semi-molten state are sprayed onto a surface of a base material and adhered to form a film. On the other hand, in this plasma spraying method, there are problems that surface irregularities are large, or a large number of pores are formed inside the film, and particles entering the inside of these pores cause a reaction with the film itself and other members, which causes the film to be consumed and corroded.

Therefore, the film is required to have low surface roughness (Ra) and low porosity. Therefore, post-treatment such as polishing is performed after film formation. However, by the post-treatment, surface-adhering particles caused by a region of the film having a thin thickness or the inner wall material that is electrostatically adsorbed on the film may be discharged at an initial stage of operation of a plasma etching apparatus. Therefore, a cleaning method of reducing the generation of the particles after the post-treatment and an inspection method of inspecting a quality of the post-treatment are required.

The atmospheric plasma spraying method is a film forming method in which air is wound during the film formation and cracks occur due to quenching. Therefore, a surface of the film includes the surface irregularities and buried pores (voids) that cause these problems. That is, a portion having lower adhesion than surroundings is generated on the surface of the film. When the polishing treatment is performed for a purpose of reducing irregularities, there is a case where the buried pores are opened and a portion having a thin thickness is generated, or a case where a film material removed by the polishing is re-adhered to the surface by static electricity. Therefore, the film is in a surface state in which initial particles caused by these cases are likely to be generated.

As one of inspection methods of inspecting the quality of the post-treatment, there is a method of evaluating the film on a surface of a member forming the inner wall of the processing chamber by detecting values of the porosity, the surface roughness (Ra), the crystallite size, the crystal phase ratio, and the like of the film after the film is formed or after the post-treatment, and comparing these values with a predetermined allowable range of a specification.

However, in the inspection method described above, after the film is formed, the film is not evaluated by comparing characteristics of the film such as the porosity, the surface roughness (Ra~arithmetic mean roughness), the crystallite size, and the crystal phase ratio with the predetermined allowable range, and for example, inspection of the member is only limited to appearance inspection. It is not clear whether the film formed on the surface of the member forming the inner wall has desired characteristics and performances (such as the porosity, the surface roughness, a residual stress, the crystallite size, the crystal phase ratio) at a portion where each member is disposed. Therefore, it is difficult to improve reliability of a cleaning step only by performing the above inspection.

As another inspection method of checking the quality of the post-treatment, there is a method of performing the inspection by cutting out a part of the member from the member inside the processing chamber. However, in this inspection method, it is necessary to performing an operation such as cleaning a part to be inspected after cutting out this part from the member. Therefore, the film of the part to be inspected is not formed in the same process as that of other members of the same type. Further, the particles may be generated on the surface of the film to be inspected in a cutting-out step, and accuracy of the inspection may be impaired.

As another inspection method of checking the quality of the post-treatment, there is a method of cutting out a part of the member and using the part for the inspection, or using one of a plurality of manufactured products for the inspection such that the film having similar performances and the characteristics such as a shape as much as possible on any one of the members and the other members is formed when the film is formed by spraying on a plurality of surfaces of a certain type of member. However, in this inspection method, when a dimension of the member is large, a unit price of the member is increased, and a manufacturing cost of the plasma processing apparatus is increased for performing the inspection.

As described above, in the above technique, reliability of the plasma processing apparatus and processing yield are impaired, and the manufacturing cost is increased.

Therefore, in the cleaning step of the protective film for a plasma processing apparatus, there is room for improvement in improving the reliability of the cleaning method by preventing the generation of the particles after the post-treatment including the cleaning step.

Embodiment

A configuration of the plasma processing apparatus according to the embodiment of the invention will be described with reference to FIGS. 1 and 2. FIG. 1 is a vertical cross-sectional view schematically showing an outline of the configuration of the plasma processing apparatus according to the embodiment of the invention. The plasma processing apparatus shown in this figure is a plasma etching apparatus that forms plasma in the processing chamber inside the vacuum chamber, and performs etching processing by using the plasma on a film structure including a mask layer previously formed on a surface of a sample such as a semiconductor wafer disposed in the processing chamber and a film layer to be processed below the mask layer.

A plasma processing apparatus 100 of the embodiment shown in FIG. 1 includes a metal vacuum chamber 1 partially having a cylindrical shape. The plasma processing apparatus 100 includes a plasma forming unit disposed above the vacuum chamber 1, including a generator that generates an electric field or a magnetic field for forming the plasma in a depressurized space inside the vacuum chamber 1, and supplying the generated electric field or magnetic field to an internal space. The plasma processing apparatus 100 further includes an exhaust unit disposed under the vacuum chamber 1, connected to the vacuum chamber 1, and including a vacuum pump that exhausts and depressurizes the space inside the vacuum chamber 1. An outer side wall of the vacuum chamber 1 is connected to a transfer chamber that is another vacuum chamber 1 and in which a wafer, which is a sample to be processed, is transferred in an internal depressurized transfer space. A side wall of the vacuum chamber 1 is provided with a gate through which the wafer is transferred to the inside, which is a passage that penetrates the side wall in a horizontal direction and communicates the inside and the outside of the vacuum chamber 1. At a position of the side wall of the vacuum chamber 1 surrounding an outer periphery of an opening portion on the outside of the gate, the transfer chamber is connected such that the space inside the vacuum chamber 1 and the space inside the transfer chamber can communicate with each other.

The vacuum chamber 1 includes a processing chamber 7 that is a space in which the sample to be processed is disposed inside and the plasma is formed. The processing chamber 7 includes a discharge unit disposed at an upper portion, having a cylindrical shape, and in which plasma 15 is formed, and a stage 6 that is a sample table having a cylindrical shape is disposed in a space of a lower portion communicating with the discharge unit. The stage 6 has a circular upper surface that is a surface on which a wafer 4 to be a base material to be processed is placed. Inside the stage 6, a heater that heats the wafer 4 and a cooling medium passage through which a cooled cooling medium flows inside are disposed. A pipe for supplying a helium (He) gas, which is a heat transfer gas, is provided between the circular upper surface of the stage 6 and a back surface of the wafer 4 placed on the upper surface.

Further, a metal electrode is disposed inside the stage 6, and a radio frequency power supply 14 that supplies a radio frequency power for forming a potential on the wafer 4 during processing of the wafer 4 using the plasma 15 to the electrode is electrically connected via an impedance matching device 13. Charged particles such as ions inside the wafer 4 are attracted to a surface of the wafer 4 due to a potential difference between the plasma and a bias potential formed on the wafer 4 by the radio frequency power during formation of the plasma 15, and the etching processing is facilitated.

The wafer 4 is placed on a tip end portion of an arm of a transfer device (not shown) such as a robot arm disposed in the transfer space inside the transfer chamber, transferred to the processing chamber 7, and then placed on the stage 6. The wafer 4 placed on the stage 6 is adsorbed and held on an upper surface of a dielectric film due to the static electricity generated by applying a direct current voltage to an electrode for electrostatic adsorption.

Above an upper end portion of a side wall member having a cylindrical shape surrounding the discharge unit of the vacuum chamber 1, a shower plate 2 and a window member 3 each having a disk shape are placed with ring-shaped members interposed therebetween. The window member 3 forms the vacuum chamber 1 together with a side wall member 41 on an outer periphery of the discharge unit. Between a lower surface of an outer peripheral edge portion of the window member 3, an upper surface of the upper end portion of the side wall member, and the ring-shaped members disposed therebetween, a seal member such as an O-ring is interposed, these members are connected, and the processing chamber 7 inside the vacuum chamber 1 and an atmosphere at an outside atmospheric pressure are airtightly partitioned.

As will be described later, the window member 3 is a disk-shaped member made of ceramics (quartz in the present embodiment) through which an electric field of microwaves for forming the plasma 15 is transmitted, and the shower plate 2 including a plurality of through holes 9 formed in a central portion thereof is disposed below the window member 3 with a gap 8 having a predetermined size as an interval. The shower plate 2 faces the inside of the processing chamber 7 to form a ceiling surface thereof, and a processing gas, whose flow rate is adjusted to a predetermined value by a gas flow rate control unit (not shown), is introduced into the gap 8, diffused in the gap 8, and then introduced into the processing chamber 7 through the through holes from above. The processing gas is introduced into the gap 8 by opening a valve 51 disposed on a processing gas supply pipe 50 connected to the ring-shaped members.

A bottom portion of the vacuum chamber 1 includes a passage that communicates the inside and the outside of the processing chamber 7, and through which the plasma 15 inside the processing chamber 7, products generated during the processing of the wafer 4, and particles of the processing gas are discharged. An opening having a circular shape of the passage on an inner side of the processing chamber 7 is disposed at a position immediately below the stage 6 disposed above as an exhaust port, which is a position where central axes can be regarded as the same when viewed from above. A turbo molecular pump 12 forming the vacuum pump of the exhaust unit and a dry pump 11 disposed downstream of the turbo molecular pump 12 are connected to a bottom surface of the vacuum chamber 1. Further, an inlet of the turbo molecular pump 12 is connected to the exhaust port by an exhaust pipe.

A valve 18 is disposed on the exhaust pipe that connects the turbo molecular pump 12 and the dry pump 11, and another exhaust pipe 10 connected to the bottom surface of the vacuum chamber 1 and communicated with the bottom portion of the processing chamber 7 is connected to a portion of the exhaust pipe between the valve 18 and the dry pump 11. This exhaust pipe 10 is connected to be branched into two pipes in the middle and then merged again into one pipe, and valves 17, 19 are disposed on branched portions, respectively. Of the valve 17 and the valve 19, the valve 17 is a slow exhaust valve for slowly exhausting the processing chamber 7 from the atmospheric pressure to a vacuum by the dry pump 11, and the valve 19 is a main exhaust valve for exhausting by the dry pump 11 at a high speed.

The processing chamber 7 is provided with a pressure sensor 75 for detecting a pressure inside the processing chamber 7. In the space of the lower portion of the processing chamber 7 between the above of the exhaust port of the present embodiment and a bottom surface of the stage 6, a pressure adjusting plate 16 having a disk shape that moves in an up-down direction in this space to open and close the exhaust port, increase or decrease an opening area of the exhaust port, and adjusts a flow rate or a speed of an exhaust gas, is disposed. The pressure in the processing chamber 7 is increased or decreased depending on balance of the flow rate or the speed of the processing gas or another gas introduced into the processing chamber 7 through gas introduction ports, which are the through holes of the shower plate 2, and the exhaust gas from the exhaust port. For example, while the gas is introduced into the processing chamber 7 from the shower plate 2 at the flow rate or the speed set to the predetermined value according to processing conditions of the wafer 4, the flow rate or the speed of the exhaust gas is adjusted such that the pressure in the processing chamber 7 according to the processing conditions is implemented by adjusting a position of the pressure adjusting plate 16 in the up-down direction.

The plasma forming unit is disposed on a metal side wall surrounding the outer periphery of the discharge unit of the processing chamber 7 on an upper portion of the vacuum chamber 1, and at positions above the window member 3 and at an outer peripheral side of the window member 3. The plasma forming unit includes a magnetron oscillator 20 that outputs the electric field of the microwaves for forming the plasma 15, and a waveguide 21 for propagating the microwaves to the processing chamber 7. The waveguide 21 includes a square portion, which extends in the horizontal direction (left-right direction in the figure) and has a rectangular or square cross section, and a circular portion having a cylindrical shape, which is connected to one end portion of the square portion and extends in the up-down direction, and the magnetron oscillator 20 is disposed at the other end portion of the square portion.

A lower end of the circular portion is connected to an upper end of a hollow portion having a cylindrical shape, which is disposed above the window member 3 and has a diameter approximately equal to that of the window member 3 and larger than a diameter of the circular portion. Further, ring-shaped solenoid coils 22 and 23, which are units that generates a magnetic field by being supplied with the direct current power, are provided above and at an outer peripheral side of the hollow portion and at a position surrounding the discharge unit of the processing chamber 7 on an outer peripheral side of the side wall of the vacuum chamber 1 surrounding the discharge unit.

An inner side wall surface of the side wall member 41 of the processing chamber 7 is a surface exposed to the plasma 15 formed in the discharge unit, and needs to include a component that functions as a ground in the processing chamber 7 in order to stabilize the potential of the plasma 15. In the present embodiment, a ring-shaped ground electrode 40 that functions as the ground in the discharge unit is disposed above the stage 6 to surround the upper surface of the stage 6. The ground electrode 40 is made of a metal member, such as a stainless alloy or an aluminum alloy, as a base material. Since the ground electrode 40 is exposed to the plasma 15, there is a high possibility that the ground electrode 40 interacts with the gases having high reactivity and corrosivity in the plasma 15 and becomes a generation source of corrosion, metal contamination, or particles due to the generated products.

Therefore, in order to prevent such a problem, as schematically shown in an enlarged cross-sectional view in a lower left portion of FIG. 1, a film 42 made of a material having high plasma resistance is disposed on a surface of the ground electrode 40 of the present embodiment to cover the surface of the ground electrode 40. By covering the surface using the film 42, the ground electrode 40 can prevent a damage such as corrosion to the ground electrode 40 due to the plasma while maintaining the function as ground. The film 42 may be a stacked film.

On the other hand, although the side wall member 41 surrounding the discharge unit of the vacuum chamber 1 of the present embodiment is made of a metal base material such as a stainless alloy or an aluminum alloy, the side wall member 41 does not have a function as the ground. In order to prevent the generation of the corrosion, the metal contamination, and the particles caused by the side wall member 41 being exposed to the plasma 15, an inner surface of the side wall member 41 is subjected to a surface treatment such as a passivation treatment, thermal spraying, PVD, or CVD. In order to prevent the base material of the side wall member 41 from being directly exposed to the plasma 15, a ceramic component as described below may be formed. That is, between the inner side wall surface of the side wall member 41 having a cylindrical shape and the discharge unit of the processing chamber 7, the ceramic component such as yttrium oxide or quartz having a ring shape or a cylindrical shape may be disposed along the inner side wall surface to cover the inner side wall surface with respect to the plasma 15. The component between the side wall member 41 and the plasma 15 hinders contact between the side wall member 41 and the plasma 15 and prevents consumption of the side wall member 41 surface-treated by the plasma 15.

FIG. 2 is a perspective view schematically showing an outline of a configuration of a component forming the ground electrode shown in FIG. 1. In FIG. 2, a diagram of the ground electrode 40 having a ring shape or a cylindrical shape shown in FIG. 1 is shown when viewed from an obliquely lower portion toward an upper side.

As shown in the figure, the ground electrode 40 has a cylindrical shape having a predetermined thickness as a whole, and has an inner side wall and an outer side wall each having an inner diameter of the same value around a central axis in the up-down direction. Further, the ground electrode 40 includes a main side wall portion having a cylindrical shape and an electrode portion having a ring shape disposed further above an upper end of the main side wall portion, and an outer peripheral wall surface of the electrode portion at a radial position from the central axis in the up-down direction is smaller than that of the main side wall portion of a lower side. An opening portion 43 having a rectangular shape of a through hole forming a gate 49 is disposed in a middle portion of the main side wall portion having a cylindrical shape in the up-down direction.

In a state where the ground electrode 40 is attached to the inside of the processing chamber 7, the ground electrode 40 is disposed between the inner side wall and the processing chamber 7. The ground electrode 40 has a length in the up-down direction such that a lower portion covers the inner side wall surface of the side wall member 41 of the vacuum chamber 1 surrounding the stage 6 with respect to the plasma 15 on the outer peripheral side of the stage 6, and an upper portion is disposed on the inner side of the side wall member 41 surrounding the discharge unit and covers the inner side wall surface of the side wall member 41 with respect to the plasma 15. This shape protects the side wall member 41 from the interaction of the plasma 15.

<Forming Method and Cleaning Method of Protective Film for Plasma Processing Apparatus>

Next, in the present embodiment, a step of performing the post-treatment after the film formation from the formation of the film (thermal spray coating) will be described with reference to FIGS. 3 to 5.

A flow of FIG. 3 illustrates a procedure that performs a forming step (the related art 1) of the film having plasma resistance that protects the ground electrode for a plasma processing apparatus, a first post-treatment (the related art 2) performed after the formation of the film, and a second post-treatment (an example of the present embodiment).

Here, first, the ground electrode is prepared, and a degreasing treatment is performed on the surface of the ground electrode (step S1). The ground electrode prepared and subjected to the degreasing treatment here is a single electrode before being incorporated into the plasma processing apparatus 100 of FIG. 1.

Next, a sandblasting treatment is performed on the surface of the ground electrode as a pretreatment for the film formation (step S2). Here, an abrasive material (particles) is sprayed onto the ground electrode. Accordingly, the surface of the ground electrode is cleaned and roughened to improve the adhesion of the film to be formed later. Next, the degreasing treatment is performed on the surface of the ground electrode (step S3).

Next, the film is formed on the surface of the ground electrode by an atmospheric plasma spraying (APS) method (step S4). Here, a film made of yttrium fluoride ($YF_3$) is formed. In addition, yttrium fluoride oxide (YOF), yttrium oxide ($Y_2O_3$), or yttrium aluminum garnet (YAG) may be used as the material of the film. The atmospheric plasma spraying method is a method of forming the film on a surface of an object by spraying in an atmosphere at the atmospheric pressure, the raw material powder is melted by the plasma formed in the atmosphere, and a raw material in the molten or semi-molten state is sprayed on the surface of the object and stacked to form the film. The steps of steps S1 to S4 up to here are referred to as the related art 1.

Next, the ground electrode on which the film is formed is immersed in pure water to perform ultrasonic cleaning (step S5). Next, a chemical treatment is performed on the ground electrode (step S6), and then the ground electrode is immersed in the pure water again to perform the ultrasonic cleaning (step S7). Next, a polishing treatment is performed on the ground electrode (step S8), and then the ground electrode is immersed in the pure water again to perform the ultrasonic cleaning (step S9). The steps (first post-treatment) of steps S5 to S9 up to here are referred to as the related art 2.

Next, the ground electrode provided with the film is immersed in dilute nitric acid, and ultrasonic irradiation is performed on the film (step S10). Next, pure water cleaning is performed on the ground electrode (step S11). The steps (second post-treatment) of steps S10 and S1*l* up to here are referred to as the example of the present embodiment. Thus, the formation of the film and the post-treatment (the first post-treatment and the second post-treatment) are completed. Thereafter, the ground electrode 40 is incorporated into the plasma processing apparatus 100 shown in FIG. 1.

The present embodiment is characterized mainly in that in addition to a film forming step (steps S1 to S4) and the first post-treatment (steps S5 to S9) performed in the related art, the ultrasonic cleaning in the dilute nitric acid (step S10) is performed under the following conditions. That is, the present embodiment is characterized mainly in that a portion having a weak bonding with the surroundings is removed by acid dissolution and ultrasonic vibration by cleaning using the ultrasonic irradiation in the dilute nitric acid.

As shown in FIG. 4, after the completion of the first post-treatment (immediately after step S9), the surface of the film 42 is in a state of having the irregularities, the pores, and the surface-adhering particles. Specifically, as the surface-adhering particles, there is a water adsorbent 43*a* adsorbed by water between the water adsorbent 43*a* and the film 42 on the surface of the film 42. Further, as the surface-adhering particles, there is an electrostatic adsorbent 43*b* that is electrostatically adsorbed to the surface of the film 42. In addition, as the surface-adhering particles, there is a stress-fixed object 43*c* that is stress-fixed by the irregularities on the surface of the film 42. Most of these surface-adhering particles are particles separated from the film 42 in a polishing step of the first post-treatment and the like, and these materials are the same as the material of the film 42.

In addition, narrow portions 42*a* are parts of the film 42, but are portions having a weak bonding with the surroundings since the portions have a small thickness. When the narrow portions 42*a* are broken or dissolved, surface particles are generated. The ultrasonic cleaning in the dilute nitric acid according to the present embodiment (step S10) prevents the particles from being generated due to a surface state of the film after the post-treatment by removing these surface-adhering particles and the narrow portions 42*a*.

However, when the ultrasonic cleaning in the dilute nitric acid is performed for a long period of time, internal pores 42*c* that are not exposed to the surface at a start of cleaning are opened by the cleaning, and a surface area increases. That is, a large number of pores 42*c* are formed in the film 42 in the vicinity of the surface of the film 42. Between the pores 42*c* particularly close to the surface of the film 42 and the surface, there are thin portions 42*b* that are parts of the film 42 and have a small thickness. When such thin portions 42*b* are dissolved by the ultrasonic cleaning in the dilute nitric acid for a long period of time, portions where the thin portions 42*b* are formed are opening portions, and the pores 42*c* are released. As a result, the surface area of the film 42 is increased.

A time of the ultrasonic cleaning in the dilute nitric acid and an elution rate of yttrium are shown in FIG. 5. The elution rate here is an elution amount (weight) per unit time of yttrium eluted from a measurement point (marker) before the time to the time. In a graph shown in FIG. 5, the example of the present embodiment is a graph implemented by plots of black squares, and here, the graph will be described. Each graph shown in FIG. 5 is obtained by averaging a plurality of plots at predetermined time intervals.

As shown in FIG. 5, when the ultrasonic cleaning in the dilute nitric acid is started, first, as a first phase 1A, the elution rate of yttrium significantly decreases. In this first phase 1A, the water adsorbent 43*a* and the electrostatic adsorbent 43*b* shown in FIG. 4 are eluted and separated from the surface of the film 42, and the elution rate of yttrium significantly decreases by removal of the water adsorbent 43*a* and the electrostatic adsorbent 43*b*.

In a second phase 1B that is approximately 10 minutes from the start of the ultrasonic cleaning in the dilute nitric acid, the decreased elution rate of the yttrium once increases and then decreases. In the second phase 1B, the remaining electrostatic adsorbent 43*b* and stress-fixed object 43*c* shown in FIG. 4 are eluted and separated. Further, in the second phase 1B, the narrow portions 42*a* are eluted, and accordingly, tip end portions connected to the narrow portions 42*a* are separated and eluted from the film 42. Therefore, in the second phase 1B, the decreased elution rate of the yttrium once increases. Thereafter, the elution rate decreases due to decrease caused by the elution of the surface-adhering particles and the narrow portions 42*a*, or the like.

Here, when the ultrasonic cleaning in the dilute nitric acid is further continued, from about an elapse of 60 minutes from the start of the ultrasonic cleaning in the dilute nitric acid, a third phase 1C, in which the elution rate of yttrium significantly increases, is entered. In the third phase 1C, the elution rate of yttrium increases by 1.5 times or more as compared with a case immediately before the third phase 1C. A reason is that the thin portions 42*b* shown in FIG. 4 are eluted and the pores 42*c* are released to increase the surface area of the film 42. In a state where the surface area of the film 42 is increased in this way, the pure water cleaning in step S11 is performed, and the ground electrode incorporated in the plasma processing apparatus is in a state where the particles are easily discharged from the film 42. That is, when the ultrasonic cleaning in the dilute nitric acid is performed for a long period of time without defining a time for performing the ultrasonic cleaning in the dilute nitric acid, it is considered that the generation of the particles cannot be effectively prevented even though the post-treatment is performed. Therefore, the ultrasonic cleaning in the dilute nitric acid needs to be stopped before an increase in the elution rate in the third phase 1C starts.

Therefore, an aspect of the present embodiment is characterized mainly in that in an ultrasonic cleaning step in the dilute nitric acid in step S10, the ground electrode to be cleaned is immersed in a dilute nitric acid solution, and the cleaning is stopped after the ultrasonic irradiation is started, the elution rate (elution amount) of yttrium decreases (first phase 1A), and then increases again and decreases again (second phase 1B), and before the elution rate increases again (third phase 1C). In other words, in the cleaning step, the elution rate of yttrium is detected during the cleaning, the elution rate of yttrium after the start of the ultrasonic irradiation sequentially goes through a first decrease, a first increase, and a second decrease, and then the cleaning is stopped before a second increase occurs. For example, in the present embodiment, the cleaning is stopped after an elapse of 10 minutes or 20 minutes after the start of the ultrasonic irradiation and before the elapse of 60 minutes.

Accordingly, the post-treatment can be completed in a state where a particle source on a surface of the inner wall material generated in the post-treatment after the film formation is removed and exposure of the pores 42*c* is prevented. That is, since it is possible to prevent the surface area of the film 42 from excessively increasing, it is possible to prevent the generation of the particles due to the surface state of the film 42 after the ground electrode is incorporated into the plasma processing apparatus. As a result, the reliability of the cleaning method of the protective film for a plasma processing apparatus can be improved.

In addition, the elution rate (elution amount) of yttrium in each of the first and second phases 1A and 1B can be obtained and set as an adhering particle index to be used as an inspection index for cleaning. That is, the elution rate in the first and second phases serves as a criterion for determining whether the cleaning is completed at a desired timing, or at which timing the cleaning is to be completed. Accordingly, the quality of the film 42 can be managed. By using the ground electrode performing such cleaning, it is possible to prevent the generation of the particles in the processing chamber of the plasma processing apparatus and improve processing yield of the wafer. From the above, the room for improvement described above can be eliminated.

Here, concentration of the dilute nitric acid used in the ultrasonic cleaning in the dilute nitric acid described above will be described. In FIG. 5, the example of the present embodiment is shown by the plots of the black squares. Here, the concentration of the dilute nitric acid is set to a medium level (0.001 mol/liter or more, 0.05 mol/liter or less). A graph implemented by plots of black circles is a graph of a comparative example in which the concentration of the dilute nitric acid is set to be higher than 0.05 mol/liter. A graph implemented by plots of black triangles is a graph of a comparative example in which the concentration of the dilute nitric acid is set to be lower than 0.001 mol/liter. A graph implemented by plots of white circles is a graph of a comparative example in a case where an object is immersed in the pure water instead of the dilute nitric acid and subjected to the ultrasonic cleaning.

As shown in the ultrasonic cleaning with the pure water (graph of the white circles), even the dilute nitric acid is not used, the elution rate significantly decreases in the first phase 1A, and since the pores 42*c* are exposed due to physical breakdown in the third phase 1C, the elution rate of yttrium increases. In addition, when the concentration of the dilute nitric acid is high (graph of the black circles), the increase of the elution rate confirmed in the second phase 1B of the example of the present embodiment occurs at a timing close to a first phase 1A side, and thus it is difficult to confirm an initial increase of the elution rate. In that case, it is difficult to perform the ultrasonic cleaning in the dilute nitric acid of the present embodiment in which the cleaning is stopped after the initial increase of the elution rate and before a re-increase. Therefore, in order to separate the first phase 1A and the second phase 1B, the concentration of the dilute nitric acid needs to be 0.05 mol/liter or less.

In addition, when the concentration of the dilute nitric acid is low (graph of the black triangles), the increase in the third phase 1C occurs before the increase of the elution rate confirmed in the second phase 1B of the example of the present embodiment occurs. That is, the third phase 1C (irradiation upper limit) is reached only by the physical breakdown due to ultrasonic waves. Therefore, it is difficult to perform the ultrasonic cleaning in the dilute nitric acid of the present embodiment in which the cleaning is stopped after the initial increase of the elution rate and before the re-increase. Further, since the narrow portions 42*a* and the stress-fixed object 43*c* in the second phase 1B cannot be removed, sufficient cleaning cannot be performed. Therefore, the concentration of the dilute nitric acid needs to be 0.001 mol/liter or more.

Results of experiments conducted by the present inventors are shown in a table of FIG. 6. The table of FIG. 6 shows the number of the particles falling on the surface of the wafer when the plasma etching is performed using the plasma processing apparatus 100 shown in FIG. 1. In the case of the related art 1 (no post-treatment), that is, in the case where a preparation step of the ground electrode and the film is completed in step S4 of FIG. 3 and the first post-treatment and the second post-treatment are not performed, an amount of the particles exceeds 100. In the case of the related art 2 in which the first post-treatment is performed, that is, in the case where the post-treatment is completed in step S9 in FIG. 3, the amount of the particles is 5.67.

On the other hand, in the case of the example of the present embodiment in which the second post-treatment is performed following the first post-treatment, that is, in the case where the post-treatment is completed in step S11 of FIG. 3, the amount of the particles is 3.76. Accordingly, in the present embodiment that performs the post-treatment in which the ultrasonic irradiation is started in the dilute nitric acid, and the cleaning is stopped after the elution rate of yttrium decreases, then increases again and decreases again and before the elution rate increases again, the particle source can be effectively removed.

Although the invention made by the present inventors has been specifically described based on the embodiment, the invention is not limited to the above embodiment, and various modifications can be made without departing from the gist of the invention.

INDUSTRIAL APPLICABILITY

The invention can be widely used in a cleaning method of a protective film for a plasma processing apparatus.

REFERENCE SIGNS LIST

1 vacuum chamber
4 wafer
15 plasma
40 ground electrode
41 side wall member
42 film
42*a* narrow portion
42*b* thin portion
42*c* pore
43*a* water adsorbent
43*b* electrostatic adsorbent
43*c* stress-fixed object
100 plasma processing apparatus

The invention claimed is:

1. A cleaning method of a protective film for a plasma processing apparatus, the protective film containing yttrium oxide or yttrium fluoride oxide or yttrium aluminum garnet and being formed on a surface of a base material disposed inside a processing chamber of the plasma processing apparatus for processing a wafer to be processed placed in the processing chamber disposed inside a vacuum chamber by using plasma formed in the processing chamber, the cleaning method comprising:

a step of cleaning performed by immersing the base material in a dilute nitric acid solution and performing ultrasonic irradiation on the protective film for the plasma processing apparatus, wherein the cleaning is stopped after an elution rate of yttrium after a start of the ultrasonic irradiation sequentially goes through a first decrease, a first increase, and a second decrease and before a second increase occurs.

2. The cleaning method of a protective film for a plasma processing apparatus according to claim 1, wherein concentration of dilute nitric acid of the dilute nitric acid solution is 0.05 mol/liter or less.

3. The cleaning method of a protective film for a plasma processing apparatus according to claim 1, wherein concentration of dilute nitric acid of the dilute nitric acid solution is 0.001 mol/liter or more.

4. The cleaning method of a protective film for a plasma processing apparatus according to claim 1, wherein concentration of dilute nitric acid of the dilute nitric acid solution is 0.001 mol/liter or more and 0.05 mol/liter or less.

5. The cleaning method of a protective film for a plasma processing apparatus according to claim 1, wherein the cleaning is stopped before an elapse of 60 minutes after the start of the ultrasonic irradiation.

6. The cleaning method of a protective film for a plasma processing apparatus according to claim 5, wherein the cleaning is stopped after an elapse of 10 minutes after the start of the ultrasonic irradiation.

* * * * *